United States Patent [19]

Levine

[11] 3,967,251

[45] June 29, 1976

[54] USER VARIABLE COMPUTER MEMORY MODULE

[75] Inventor: Leonard Levine, Rancho Palos Verdes, Calif.

[73] Assignee: Xerox Corporation, Stamford, Conn.

[22] Filed: Apr. 17, 1975

[21] Appl. No.: 569,050

[52] U.S. Cl. .................. 340/172.5; 340/173 SP
[51] Int. Cl.² ...................................... G06F 13/08
[58] Field of Search ............... 340/173 SP, 172.5; 445/1

[56] References Cited
UNITED STATES PATENTS

| | | | |
|---|---|---|---|
| 2,909,592 | 10/1959 | Morris et al. | 340/173 SP X |
| 3,027,548 | 3/1962 | Vaughan | 340/173 SP X |
| 3,038,105 | 6/1962 | Brownfield | 340/173 SP X |
| 3,093,819 | 6/1963 | Lynch | 340/173 SP X |
| 3,350,691 | 10/1967 | Faulis et al. | 340/172.5 |
| 3,355,722 | 11/1967 | Grubb et al. | 340/173 SP |
| 3,487,372 | 12/1969 | Vinal | 340/172.5 |
| 3,671,948 | 6/1972 | Cassen et al. | 340/173 SP |
| 3,713,110 | 1/1973 | Bennett et al. | 340/173 SP |
| 3,735,358 | 5/1973 | Ho | 340/173 SP |
| 3,750,111 | 7/1973 | Kobylar et al. | 340/172.5 |
| 3,755,793 | 8/1973 | Ho et al. | 340/173 SP |
| 3,786,436 | 1/1974 | Zelinski et al. | 340/172.5 |
| 3,787,822 | 1/1974 | Rioult | 340/173 SP |
| 3,790,959 | 2/1974 | Eldert | 340/172.5 |
| 3,818,252 | 6/1974 | Chiba et al. | 340/173 SP X |
| 3,859,653 | 1/1975 | Watson et al. | 340/172.5 |

Primary Examiner—Raulfe B. Zache
Assistant Examiner—Jan E. Rhoads
Attorney, Agent, or Firm—James J. Ralabate; Franklyn C. Weiss; Robert E. Cunha

[57] ABSTRACT

A memory module containing addressable memory devices, and the circuits necessary to address and drive these devices, is configured so that a trade-off between memory size and word length can be made by rewiring the backplane. Thus, a single memory module design can be used for a variety of computer memory applications. This is accomplished by incorporating on the module a complete set of addressing and signal driving circuits, and allowing for the control of these module components through a system of control lines wired through the backplane.

9 Claims, 8 Drawing Figures

USER VARIABLE COMPUTER MEMORY MODULE

BACKGROUND OF THE INVENTION

1. Field of the Invention

This invention relates to computer technology and more specifically to a circuit for use in a computer mass memory where MOS memory devices, read/write drivers, and clock and reset pulse drivers are configured on a printed circuit board so that, by changing the backplane wiring, this one mass storage module can be used for a wide variety of memory size and word length applications. For instance, the module described as the preferred embodiment can be reconfigured from 4,000 words of 18 bits in length (4K × 18) to 36,000 words to 2 bit length (36K × 2) using the same module and by rewiring the backplane. In general mathematical terms, devices each having P address lines and storing $2^P × 1$ bits, arranged into $m$ rows of $n$ columns can be reconfigured to store from $2^P m$ words of $n$ bits to $2^P mn$ words of 1 bit depending on the backplane wiring.

2. Description of the Prior Art

Increasingly, computer manufacturers are implementing mass memory from MOS storage devices. A typical device is the 4,000 word by one bit device sold by Advance Memory Sytems, Inc. as Model No. AMS 6002.

Typically, a computer manufacturer has a particular memory configuration in mind while designing memory mass storage modules and designs the modules to the specific purpose. The result is a variety of mass storage modules requiring a number of test programs, assembly procedures, and printed circuit board layouts.

Attempts have been made to provide general purpose or "building block" memory modules which may allow for the variations in memory size and word bit length by using modules in parallel to increase the width and depth of the memory and, conversely, by using less than a full complement of devices in a module to produce a shorter than nominal word length. For instance, a module can be converted from an 18 bit board to a 4 bit board by removing fourteen of the eighteen columns of memory devices. Of course, depopulating a module by removing a significant fraction of the devices is an inefficient use of space on a module and therefore an inefficient use of mass memory storage volume.

There is, therefore, a need for a standard module which can be used variously for a larger number of smaller bit length words or a smaller number of larger bit length words without the necessity of any changes on the module itself.

SUMMARY OF THE INVENTION

This invention comprises a circuit for mass storage which can be assembled on a standard printed circuit board and which can variously be used as a mass storage for a larger number of smaller words or a smaller number of larger words, the conversion being accomplished by changes in backplane wiring.

This invention is implemented by arranging storage devices into rows and columns on a printed circuit board. Any number of rows and columns can be used but it has been found that four rows and 18 columns is a useful configuration. These MOS devices are driven by 10 address line drivers, eight clock and reset pulse drivers, and nine sets of read/write amplifiers. The reset and clock pulse lines to each row may be driven separately and the outputs of the read/write amplifiers may be collector ORed in the backplane. Furthermore, each individual read/write amplifier may be separately enabled. The result is a module which may be reconfigured, as described above, merely by making changes in the backplane wiring. That is to say, the same module may be plugged into various module connectors of the backplane and, without more, may be reconfigured into the desired word size and bit length.

An example of this use would be as follows. The common sizes of bits per word in mass storage are 16 and 32 bits per word. After the addition of error code bits and parity bits, these word sizes would become 22 bits and 40 bits. Using these modules, a 16K by 4 bit memory could be implemented from four standard modules configured as 4K by 18 bit modules and a fifth module configured as a 16K by 4 bit module. Likewise, a 16K by 40 bit memory could be implemented from eight 4K by 18 bit modules and one 16K by 4 bit module. Of course, the 16K × 4 bit modules would require eight fewer devices than the 4K by 18 bit modules and this modification could be accomplished entirely by removing two columns of storage devices from the module.

In the preferred embodiment described herein, the computer CPU elements are implemented from TTL devices so that addressing information, data bits and clock pulses from the CPU to the memory module are at TTL signal levels. However, the memory comprises MOS technology. Thus, level shifters are required to convert all signals from one level to the other as well as to provide power for fan-out requirements. These elements have been included on the module described in this specification.

Thus, it can be seen that, through the use of this invention, a standard mass memory module can be implemented from MOS devices such that a reconfiguration comprising a trade-off between word length and memory size may be accomplished entirely through changes in backplane wiring.

DESCRIPTION OF THE PREFERRED EMBODIMENT

Figure 1:
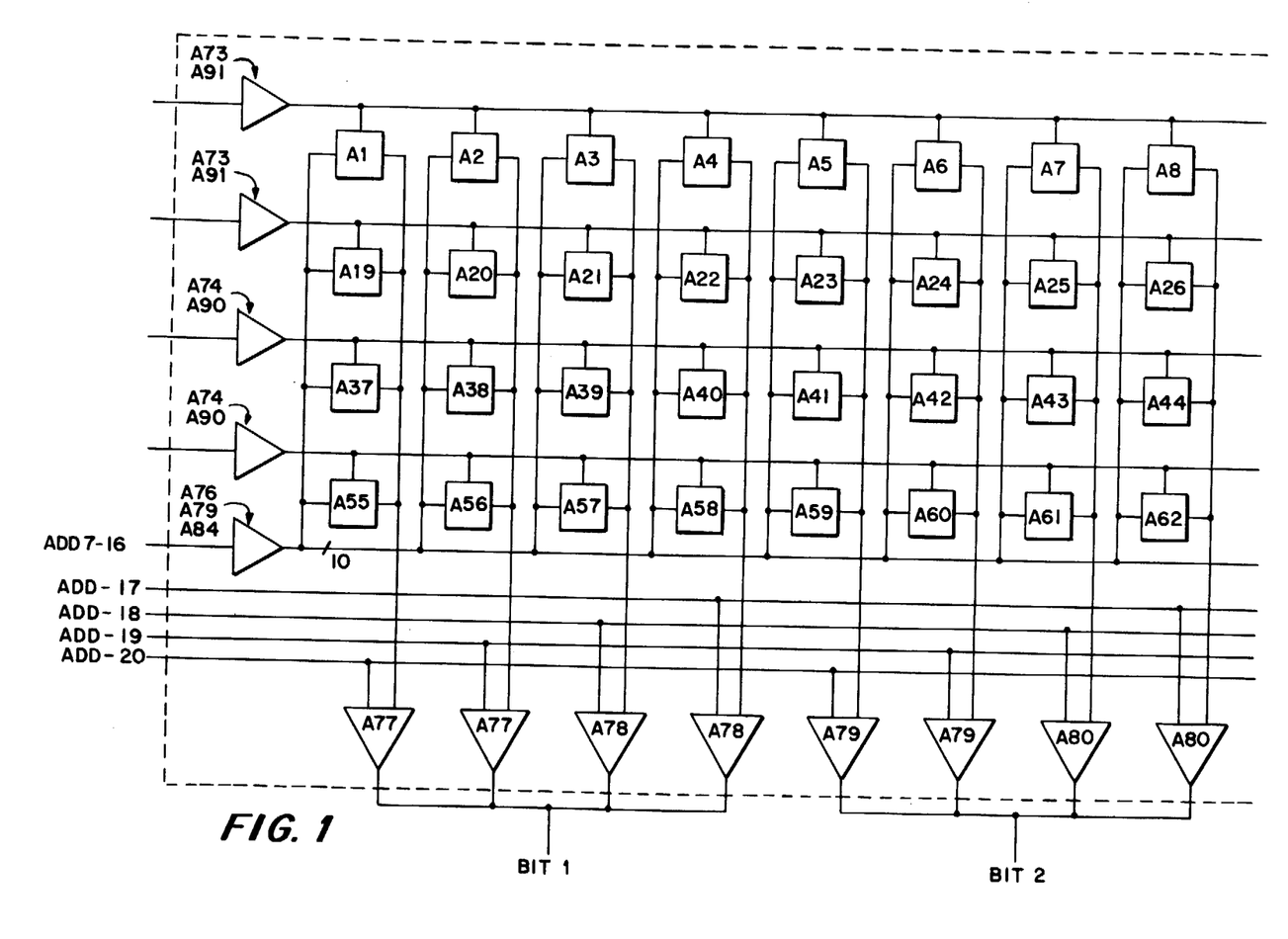
FIG. 1 is a partial block diagram of the memory module.

FIG. 1 is a partial block diagram of the preferred embodiment of a memory module indicating how the eight columns at the left end of the module may be connected to provide a 16K × 2 bit word capacity. The module comprises the elements within the dotted lines, and the lines extending through the dotted lines represent backplane wiring connecting this memory module to other memory modules and to the computer CPU.

Addressable Memory Devices A1 through A72 each contain 1,024 bits of data (1K × 1 bit), each bit addressable by 10 address lines from Address Line Amplifiers A76, A79 and A84.

Since there are four rows of Memory Devices and since each row is selectable through Pulse Drivers A73, A74, A90 and A91, the word size of the module becomes 4K. In operation, the entire module is addressed through the Address Line Amplifier while one row is enabled by one of the Pulse Drivers. Without more, the result would be a 4K memory producing one bit per column.

To convert the module to a 16K memory size, four more address lines are brought in to enable one of each set of four Read/Write Amplifiers A77, A78, A79 and A80. Also, the outputs are collector ORed. Thus, an entire row is enabled at each memory access, but only the selected bits are passed through the Read/Write Amplifiers. By this method and means, the apparatus of FIG. 1 contains a memory of 16K × 2 bits.

The memory size has been determined by the addressing information received from the CPU and the collector ORing of the Read/Write Amplifier. The Memory Module itself is unchanged, and could be removed from this position on the backplane to another position wired for a 4K memory size with no modification to the module.

Figures 2A, 2C:
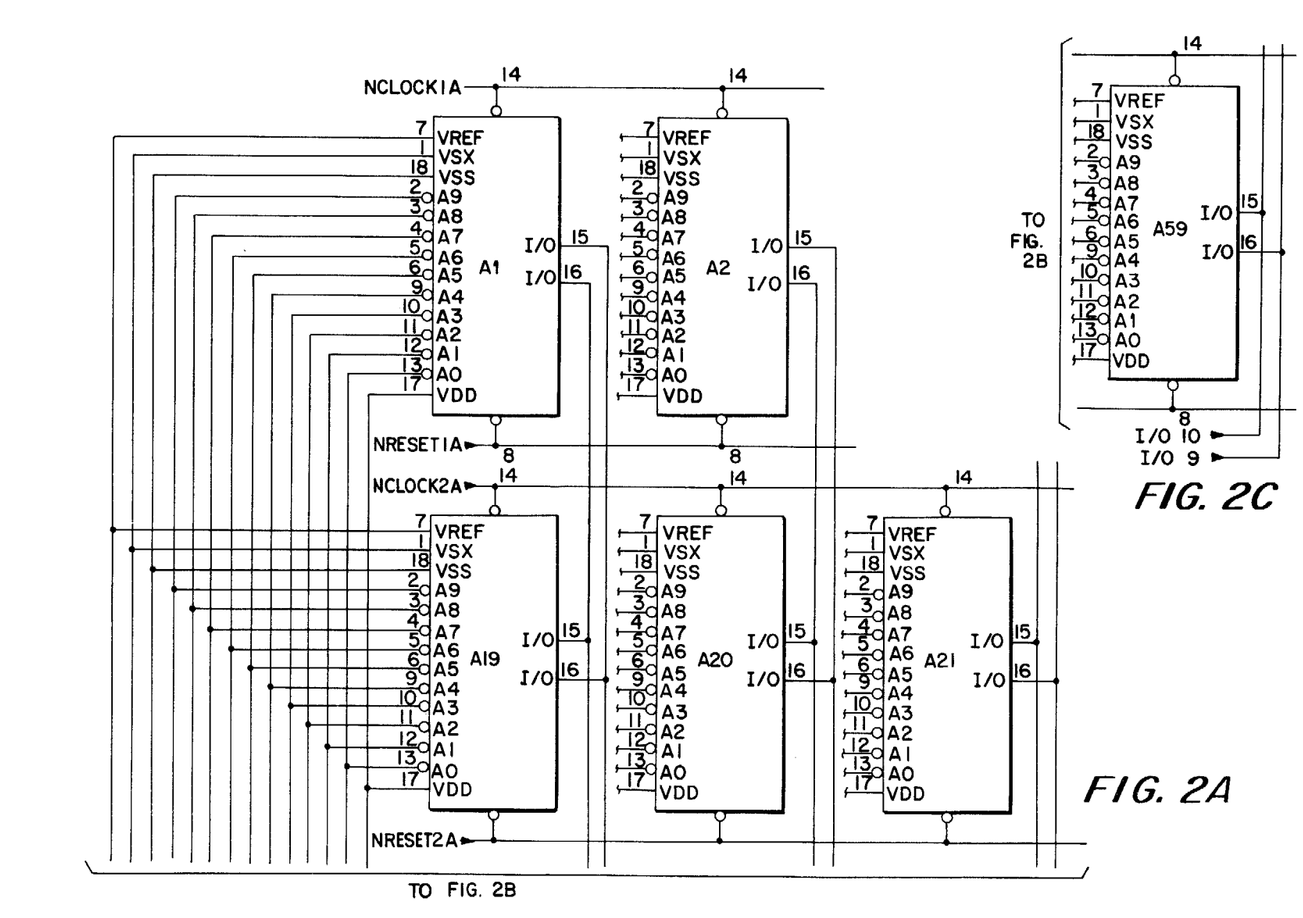
FIGS. 2A, 2B, and 2C when taken together comprise a partial schematic showing the interconnections between the storage units.
Figure 2B:
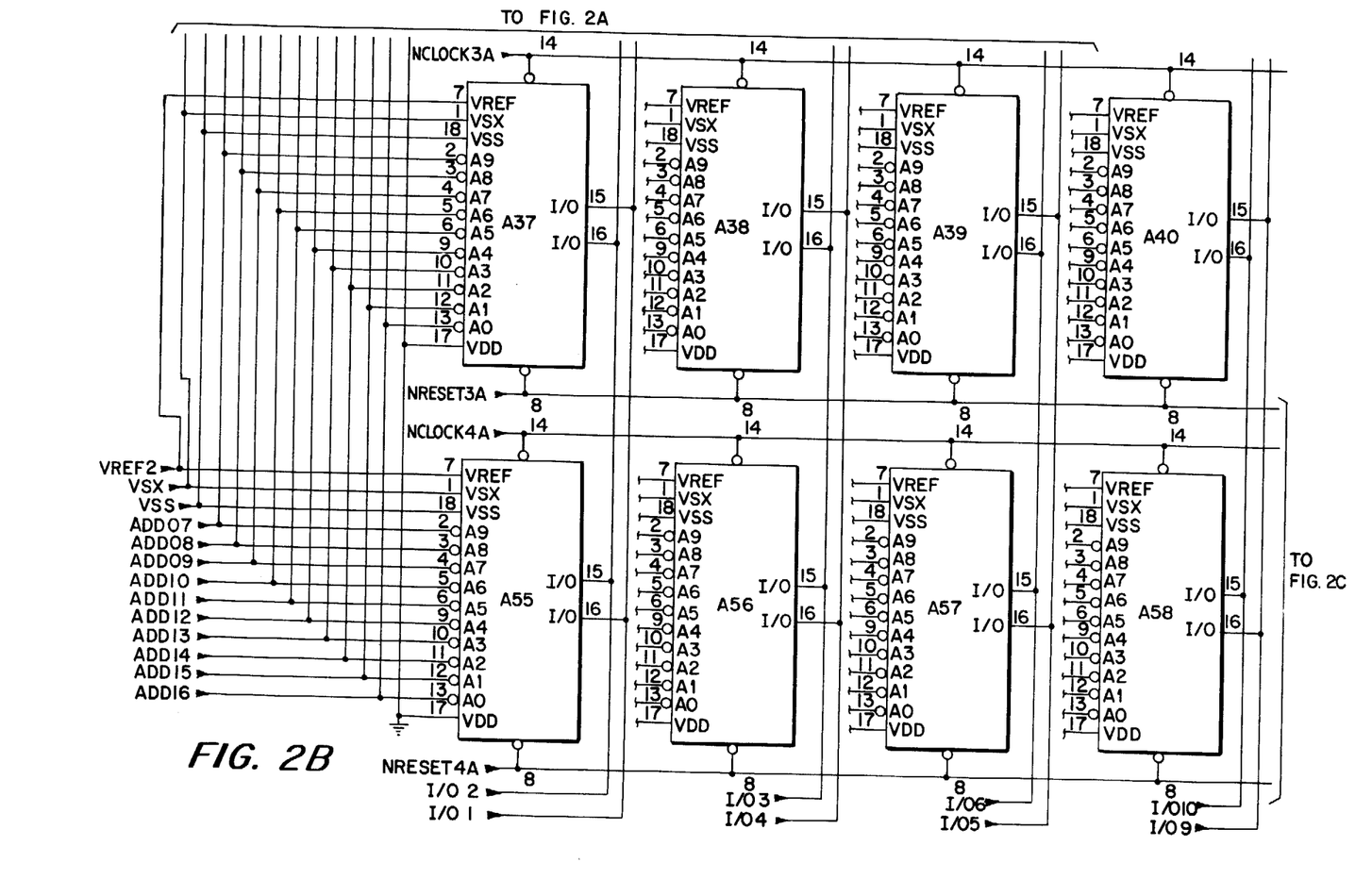

FIGS. 2A–2C comprise a partial schematic diagram of the MOS storage devices. The preferred embodiment contains four rows, each row containing 18 devices. Because of the repetitive nature of the schematic, only the left most portions of these four rows have been shown in the cut-out schematic of FIG. 1. Thus, for example, only the first two devices A1 and A2 of the first row of devices are shown. Likewise, only the last three devices A21, A39 and A57, of the four devices in column 3 are shown. Since each device contains 4K × 1 bits, this implementation would therefore be suitable for storing 4K × 18 bits, 36K × 2 bits, or some other appropriate combination.

As indicated, all of the devices in the same row are tied together through a reset line and a clock line. Devices in the first row for instance, are connected through clock line NCLOCK1A and reset line NRESET1A. Also, all devices in a column are connected through their input/output lines. All of the devices in column 1 are connected through lines I/O 2 and I/O 1. These lines ultimately connect to the input/output pins of the Read/Write Amplifiers. Each device may be read from by supplying a reset pulse, followed by a clock pulse. Pulses are defined as a low state on the signal line. The two input/output lines of each device, labeled I/O on the device and shown on the schematic as pins 15 and 16, are actually the source of an analog differential current which is sensed by a differential current amplifier circuit in the Read/Write Amplifier.

Thus, it can be seen that every device in a row is activated by a reset and clock pulse and therefore every set of I/O lines will contain an information-bearing differential current. Whether all, half, or some other fraction of these signals are used as outputs from the mass memory will be determined by the implementation of the Read/Write Amplifier to be discussed in relation to FIG. 3.

As shown in FIGS. 2A–2C the addressing of all devices on the entire module is common in that every device, whether clocked or not, will receive the same addressing information. This invention is provided by Address Line Amplifiers to be discussed in relation to FIG. 5.

The remaining inputs to the device are power supply inputs. The input labeled VDD will be kept at ground potential as shown in FIGS. 2A–2C. $V_{bb}$ is an input of 24 volts, VSS operates at 21 volts and VRFF is approximately 8.2 volts. All of these voltages are supplied by an external power supply.

It should be remembered that although this preferred embodiment uses MOS devices, the invention would work equally well with memory devices implemented from some other technology.

Figure 3:
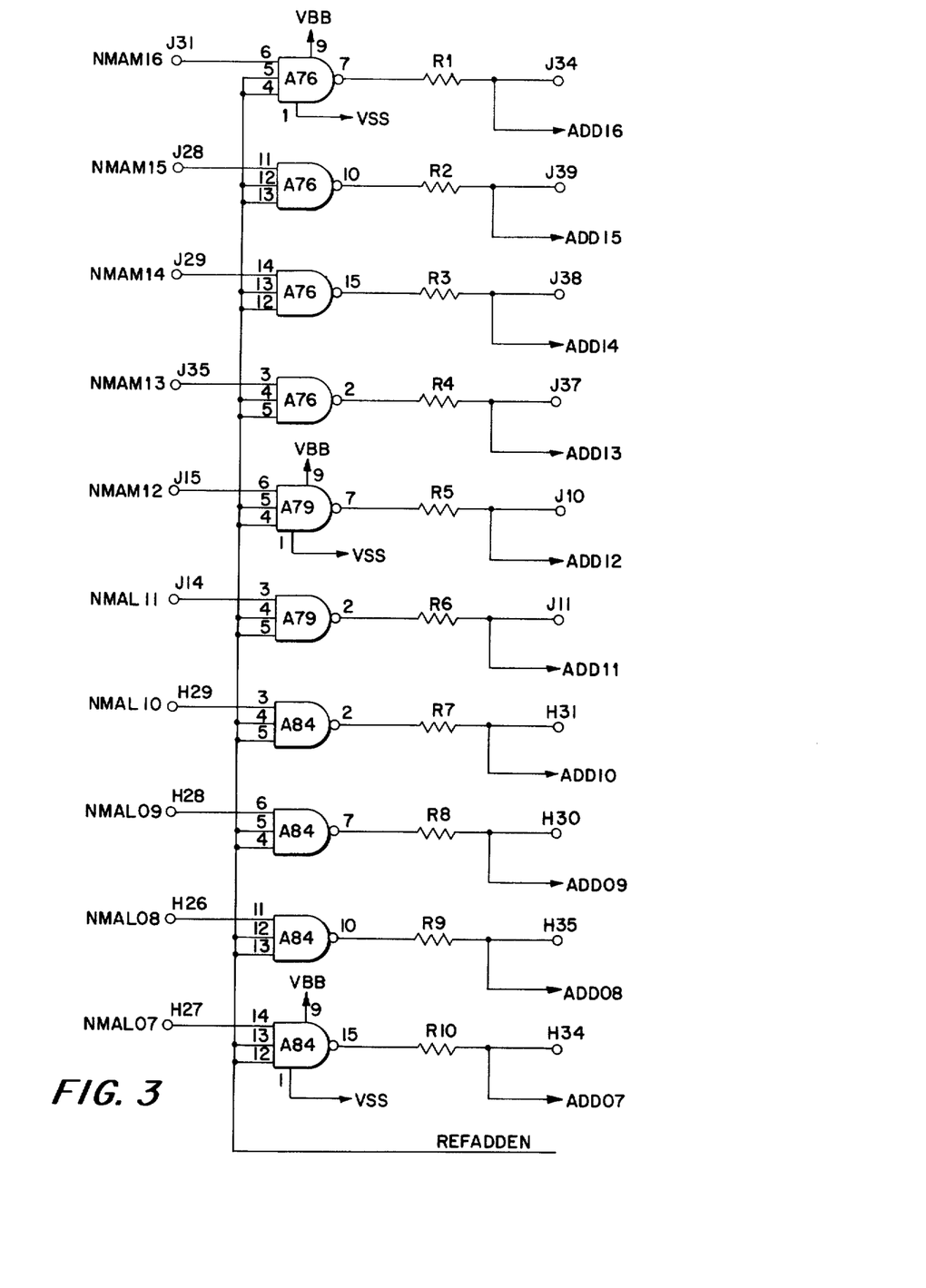
FIG. 3 is a schematic of the address line drivers.

FIG. 3 is a schematic of the Address Line Amplifiers which are TTL to MOS level shifters. These are quad units, the four Address Line Amplifiers labeled A76 of FIG. 3 are contained within the same package designated as a Texas Instruments Model No. 75365 device. Equivalents are available from other semiconductor vendors. These Address Line Amplifiers receive TTL level signals from the computer corresponding to 10 lines of addressing information and are amplified and level shifted by these devices before being sent to the address inputs of the Memory Devices shown in FIGS. 2A–2C.

Figure 4:
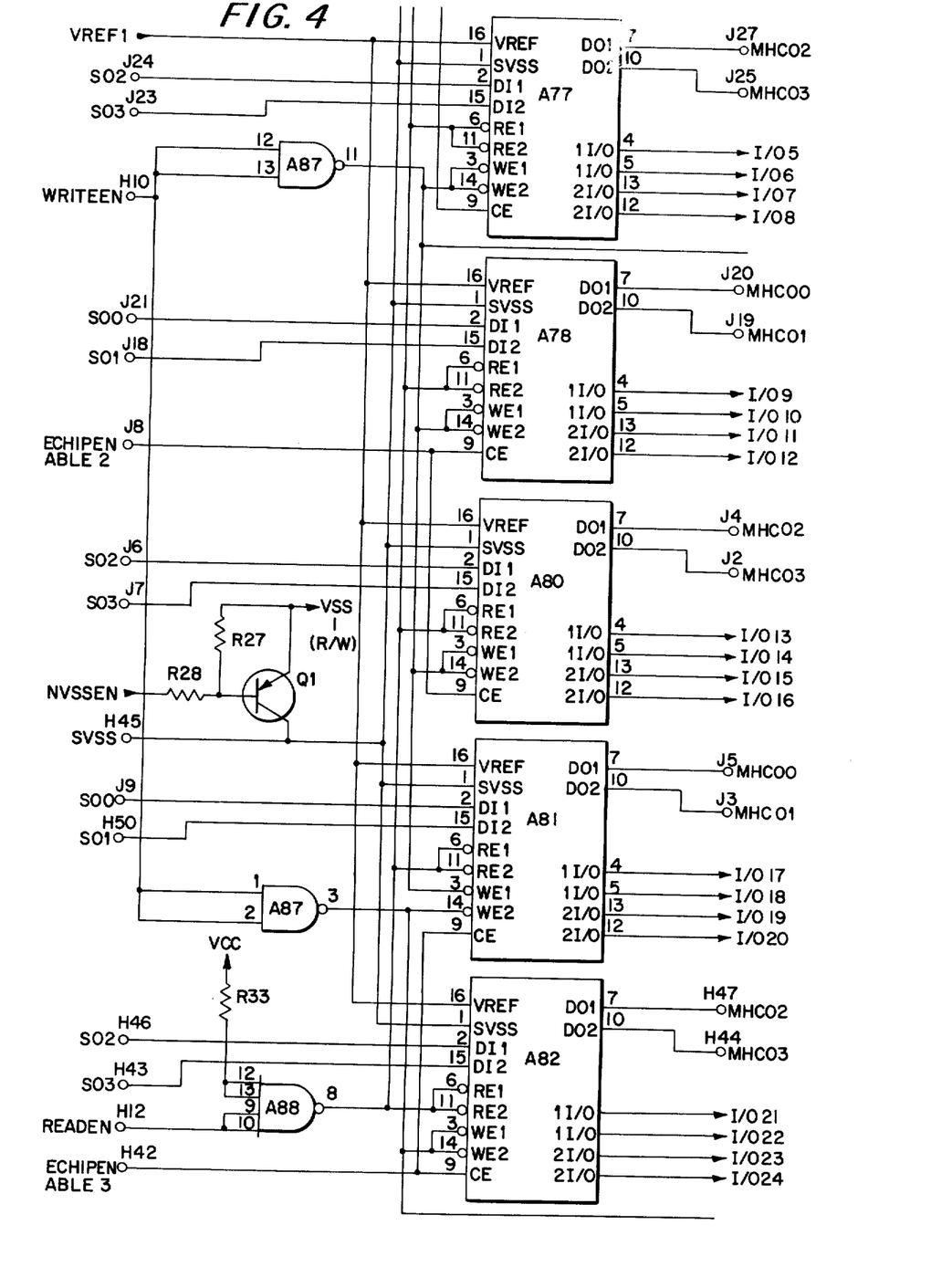
FIG. 4 is a partial schematic of the read/write amplifier circuits.

On FIG. 4 are shown five Read/Write Amplifiers or drivers. The module contains a total of nine of these devices but because of the redundant nature of the schematic only five have been shown. In fact, each device labeled A77 through A82 consists of two Read/Write Amplifiers on a chip and thus the nine devices are capable of reading from or writing into 18 columns of MOS Memory Devices.

The CE input at Pin 9 of each device is a chip enable input which allows the device to either read or write on the input/output lines connecting it to the Memory Device columns. Thus, devices A78 and A80, Pins 9, are interconnected to a chip enable line labeled ECHIPENABLE2. This chip enable signal will activate two devices resulting in a minimum unit of four bits which may be activated. This arrangement is used since the modules are always used to produce words that are a multiple of four bits in length. Had each separate chip enable line been brought out separately, any word length a multiple of two bits could be produced with no further change of the module.

Each Read/Write Amplifier of FIG. 4 receives 8.2 volts at the VREF input Pin 16, and a SVSS input at Pin 1 of 21 volts. Notice that the SVSS is supplied by Transistor Q1 which, in turn, is switchable by signal NVSSEN. This is a power saving feature in that only those Read/Write Amplifiers on the module being read from or written into are activated, all other modules in the computer mass storage are not activated, and a considerable savings in power supply current is effected. The DI1 and DI2 inputs of each device at Pins 2 and 15 are the data inputs from the computer, the RE1 and RE2 inputs at Pins 6 and 11 are the read enable lines, and the WE1 and WE2 inputs at Pins 3 and 14 are the write enable lines. On the right hand side of the device, outputs DO1 and DO2 at pins 7 and 10 are the data output lines and the remaining four lines at Pins 4, 5, 13 and 12 are the pairs of differential current input/output lines going to each column of Memory Devices. The signal lines going to the computer, DI1, DI2, DO1 and DO2 are at TTL levels whereas the differential current lines labeled 1I/O and 2I/O at Pins 4, 5, 13 and 12 are at MOS levels. These lines are both inputs to and outputs from the Memory Devices.

Figure 5A:
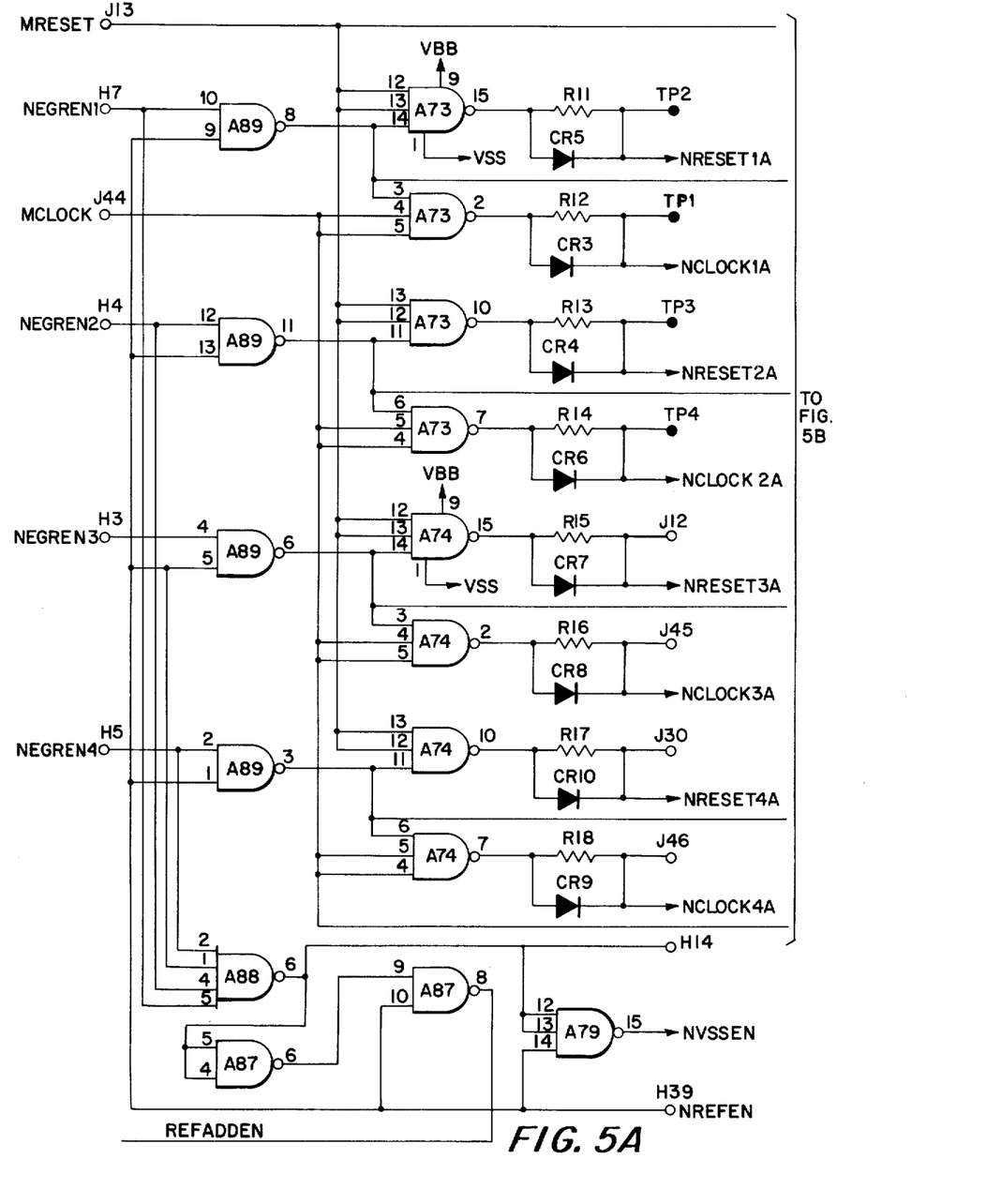
FIGS. 5A and 5B when taken together comprise a schematic of the clock and reset line level shifters or pulse drivers.
Figure 5B:
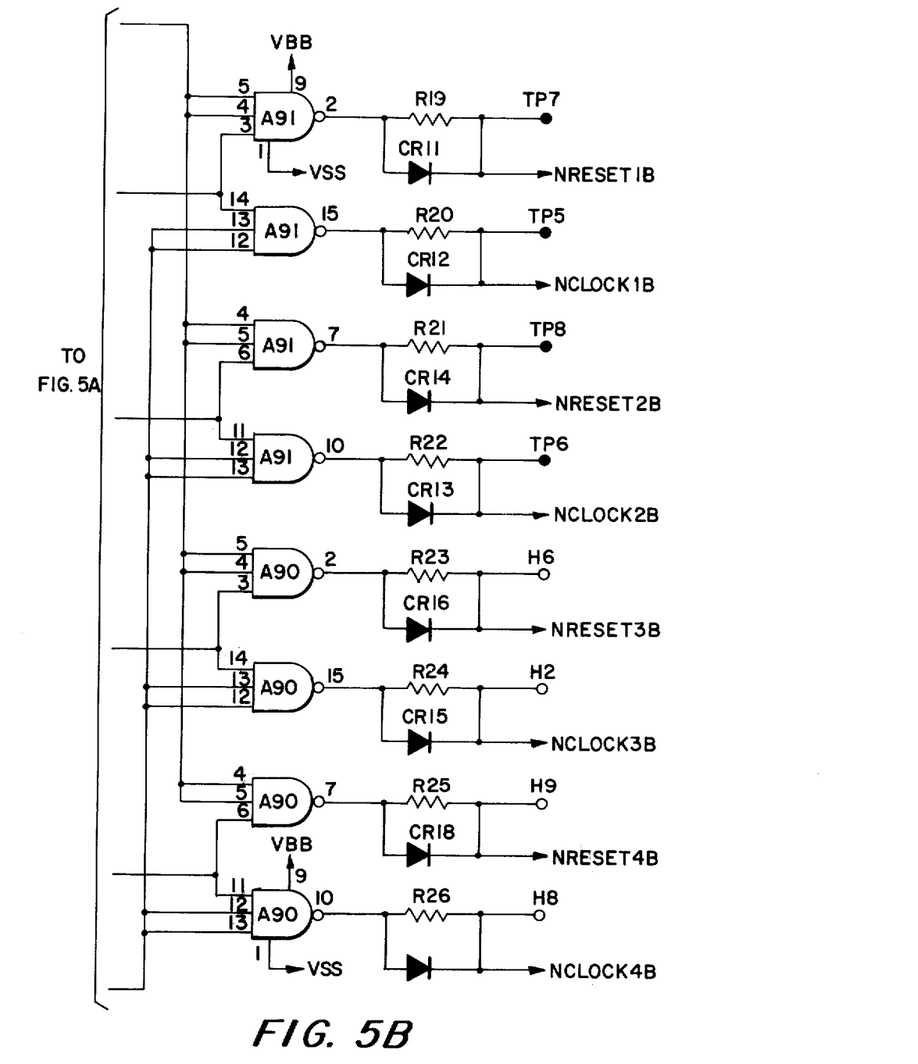

FIGS. 5A–5B comprise a schematic of the eight sets of Reset and Clock Pulse Driver circuits which are also implemented from Texas Instruments Model No. 75365 TTL to MOS level shifters and are used to generate the two timing pulses necessary to operate the Memory Devices, the reset and clock pulses. The output of each device has the capability of driving nine Memory Devices. Thus, the reset signal comes into this module on the MRESET line and is connected to every other Pulse Driver. The remaining Drivers are driven by the MCLOCK line which brings in the clock pulse at a somewhat later time. The time relationships between the reset and clock pulses are determined by the Memory Device vendor. These reset and clock pulses are amplified and are produced at the outputs of these Drivers at lines NRESET1A through 4A and NRESET1B through 4B. Likewise, the clock pulses are produced on lines NCLOCK1A through NCLOCK4A and NCLOCK1B through NCLOCK4B. At the bottom of the schematic, signal NVSSEN, which is used to drive Transistor Q1 of FIG. 4, is generated so that the appropriate module may be enabled.

These circuits comprising 72 Memory Devices, 18 Read/Write Amplifiers, and the associated level shifting circuits of FIGS. 2 and 4 may all be mounted conveniently on a standard sized printed circuit module and comprise a preferred embodiment of the instant invention. However, it is to be understood that other technologies and other circuit details could be employed. For instance, TTL rather than MOS Memory Devices could be used, and other numbers substituted for the 4K × 18 storage unit configuration proposed in this preferred embodiment.

While a particular embodiment of the present invention has been described and illustrated it will be apparent to those skilled in the art that changes and modifications may be made therein without departure from the spirit and scope of the invention as claimed.

What is claimed is:

1. In a digital computer comprising a central processing unit (CPU) and memory connected by backplane wiring, a memory module which can be reconfigured for various memory size and word length applications by rewiring said backplane, comprising:
    addressable memory devices arranged in rows and columns,
    address line amplifiers for receiving addressing information from said CPU and for driving the address input lines of said memory devices,
    a pulse driver coupled to said CPU for each row of memory devices for enabling said row of memory devices to store or output signal information bits,
    a read/write amplifier for each column of memory devices for coupling one bit of information between said CPU and said memory devices in each column,
    a printed circuit board for mounting said memory devices, said address line amplifiers, said pulse drivers and said read/write amplifiers, and
    wherein said backplane wiring is individually coupled to each of said read/write amplifiers for ORing the input/output lines of said read/write amplifiers and for selectively enabling all of said read/write amplifiers or any subset thereof, to configure said memory module to a particular memory size and word length.

2. The apparatus of claim 1 wherein a plurality of said memory modules are coupled in parallel to extend the effective length of each row, thereby increasing the word size of said computer memory.

3. The apertures of claim 1 wherein a plurality of said memory modules are coupled in parallel to extend the effective depth of each column, thereby increasing the memory size of said computer memory.

4. The apparatus of claim 3 further comprising switching means for supplying electrical power to the read/write amplifiers of the one module of said plurality that is currently being written into or read from.

5. In a digital computer comprising a central processing unit and memory connected by backplane wiring, a memory module which can be reconfigured for various memory size and word length applications by rewiring said backplane comprising:
    a plurality of addressable memory devices arranged in $m$ rows of $n$ columns, each memory device having P address line inputs and storing $2^P$ bits,
    P address line amplifiers for driving the address input lines of all of said memory devices,
    $m$ pulse drivers, each one for enabling the reading into or writing out from said memory devices in any one row of said memory device,
    $n$ read/write amplifiers, one for each column of said memory devices for supplying to or for receiving from all of said memory devices in said column one bit of each memory module output word,
    a printed circuit board on which said memory devices, said address line amplifier, said pulse drivers and said read/write amplifiers are mounted, and
    wherein said backplane wiring is individually coupled to each of said read/write amplifiers for selectively ORing the input/output lines of subsets of said read/write amplifiers and for enabling one read/write amplifier in each of said subsets to configure said memory module to store $2^P mn$ bit words, $2^P mn$ one bit words, or variations therebetween, the total bit size of said memory module not to exceed $2^P mn$ bits.

6. In a computer comprising a central processing unit (CPU) and memory connected by backplane wiring, the method of configuring a memory module comprising rows and columns of addressable memory devices into any one of several variations of memory size and word length by providing a standard memory module and rewiring the backpanel comprising the steps of:
    arranging addressable memory devices onto said memory module in rows and columns wherein the number of rows multiplied by the number of locations per memory device represents the maximum number of words that the module may contain and the number of columns represents the maximum number of bits the output word may contain,
    addressing all memory devices through the backplane wiring,
    enabling the input/output of all devices in any one row of memory devices by providing an enabling signal through the backplane wiring,
    transmitting the inputs/outputs of all memory devices in each column to a read/write amplifier located on said memory module,
    connecting together into subsets those wires in the backplane which couple the CPU to the read/write amplifiers, and
    enabling one of each subset of read/write amplifiers by providing a read/write enabling signal through the backplane wiring so that one bit of binary information may be transmitted between the CPU and one location of one memory device for each subset of columns.

7. The method of claim 6 including the step of connecting an extension module identical to said memory module in parallel to said memory module to increase the word length.

8. The method of claim 6 including the step of adding an extension module identical to said memory module and accessing either said extension module or said memory module to increase the memory size of said memory.

9. The method of claim 8 including the step of disconnecting the power to the read/write amplifiers of the nodule not currently being accessed to conserve power.

* * * * *